(12) United States Patent
Lee

(10) Patent No.: US 7,061,813 B2
(45) Date of Patent: Jun. 13, 2006

(54) PAGE BUFFER OF NON-VOLATILE MEMORY DEVICE AND METHOD OF PROGRAMMING AND READING NON-VOLATILE MEMORY DEVICE

(75) Inventor: Sok Kyu Lee, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 46 days.

(21) Appl. No.: 11/014,507

(22) Filed: Dec. 16, 2004

(65) Prior Publication Data

US 2006/0013045 A1 Jan. 19, 2006

(30) Foreign Application Priority Data

Jul. 15, 2004 (KR) .................... 10-2004-0055273

(51) Int. Cl.
*G11C 7/10* (2006.01)
*G11C 8/00* (2006.01)

(52) U.S. Cl. ........................ 365/189.05; 365/189.12; 365/230.08; 365/185.17

(58) Field of Classification Search ........... 365/189.05, 365/189.11, 189.12, 230.08, 185.17
See application file for complete search history.

(56) References Cited

U.S. PATENT DOCUMENTS

| 5,625,590 | A  | * | 4/1997  | Choi et al. ............. | 365/185.17 |
| 5,724,284 | A  | * | 3/1998  | Bill et al. ............... | 365/185.2  |
| 5,768,215 | A  | * | 6/1998  | Kwon et al. ............. | 365/238.5  |
| 6,826,082 | B1 | * | 11/2004 | Hwang et al. ......... | 365/185.17 |
| 6,963,509 | B1 | * | 11/2005 | Ju .......................... | 365/189.05 |
| 7,016,229 | B1 | * | 3/2006  | Kim ...................... | 365/185.17 |

* cited by examiner

*Primary Examiner*—Richard Elms
*Assistant Examiner*—Eric J. Wendler
(74) *Attorney, Agent, or Firm*—Marshall, Gerstein & Borun LLP

(57) ABSTRACT

A page buffer of a non-volatile memory device and a method for programming and reading the same is provided. The page buffer includes a first latch unit and one or more second latch units for storing data, transfer units connected between the first latch unit and the second latch units for transferring the data stored in the first latch unit to the second latch units, a path select unit that that senses data from bit lines and stores the sensed data in the first latch unit, and, in a program operation, transfers the data from the first and second latch units to the bit lines, a sensing unit for allowing the path select unit to sense data or the data received from the bit lines to be stored in the first latch unit, and a data I/O unit.

17 Claims, 3 Drawing Sheets

PAGE BUFFER OF NON-VOLATILE MEMORY DEVICE AND METHOD OF PROGRAMMING AND READING NON-VOLATILE MEMORY DEVICE

This application relies for priority upon Korean Patent Application No. 2004-0055273 filed Jul. 15, 2004, the contents of which are herein incorporated by reference in their entirety.

BACKGROUND

1. Field of the Invention

The present patent relates to a semiconductor memory device, and method for programming and reading the same, and more specifically, to a page buffer of a non-volatile memory device, and method for programming and reading the same.

2. Discussion of Related Art

A semiconductor memory device can be classified into a volatile memory device in which stored information is erased as the supply of electricity is stopped and a non-volatile memory device in which information keeps stored even if the supply of electricity is stopped. The non-volatile memory device may include EPROM (Erasable Programmable Read Only Memory), EEPROM (Electrically Erasable Programmable Read Only Memory), a flash memory device and the like.

In the flash memory device, a memory cell which stores data includes cell transistors. Each of the cell transistors has a control gate and a floating gate. The flash memory device stores information using a tunneling phenomenon through an insulating film.

The flash memory device can be classified into a NOR type flash memory device and a NAND type flash memory device depending on the configuration of cells. The NOR type flash memory device is typically adapted to read a small amount of information in a non-sequential manner at high speed, whereas the NAND type flash memory device is typically adapted to read information in a sequential manner. The NAND type flash memory device programs or stores data using a page buffer.

FIG. 1 is a schematic layout diagram of a cell array region and a page buffer in the prior art. In FIG. 1, A' and B' are expanded views of portions "A" and "B", respectively, and reference numeral 10 indicates a cell array region.

The conventional page buffer has a structure in which four pager buffers are stacked in consideration of the layout of the page buffer, as shown in FIG. 1. For this reason, however, even page buffers applied to the same memory cell array have different shapes because of a difference in layout. Accordingly, during a read operation, a SO node being a sensing node of the page buffer is floated, and the degree that the SO node is affected by outside influence becomes different, so that the four page buffers have a different sensing difference. Therefore, there is a problem in that errors occur in testing. That is, during the read operation, the sensing node is floated. Accordingly, there are problems in that the sensing node does not detect a correct value in detecting data, and a failure is thus generated due to coupling capacitance with a neighboring sensing node. Furthermore, as semiconductor technology is advanced, the layout of the page buffer becomes difficult and several stages of page buffers are used accordingly. Accordingly, failure by the coupling capacitance among the sensing nodes becomes more problematic.

SUMMARY

The present patent provides a page buffer of a non-volatile memory device in which coupling capacitance among sensing nodes can be eliminated.

It is an object of the present patent to provide a method of programming a non-volatile memory device.

It is still another object of the present patent to provide a method of reading a non-volatile memory device.

According to an exemplary embodiment of the present patent, there is provided a page buffer of a non-volatile memory device, having a first latch unit for storing data, one or more second latch units for storing data, transfer units connected between the first latch unit and the second latch units, for transferring the data stored in the first latch unit to the second latch units, a path select unit that, in a read operation, senses data from bit lines and stores the sensed data in the first latch unit, and, in a program operation, transfers the data from the first and second latch units to the bit lines, a sensing unit for allowing the path select unit to sense data or allowing the data received from the bit lines to be stored in the first latch, and a data I/O unit for transferring the data from a data line to the first and second latch units or the data stored in the first and second latch units to the data line.

Furthermore, there is provided a method of programming a non-volatile memory device, having the steps of storing data in a first latch unit, sequentially storing data in a plurality of second latch units, the number of which is one smaller than the number of plural pairs of bit lines to be read or programmed, and selecting a memory cell to be programmed and programming the data stored in the first latch unit and the second latch units into the selected memory cell according to a program control signal.

Furthermore, there is provided a method of reading a non-volatile memory device, having the steps of sensing data of a selected memory cell and storing the sensed data in a first latch unit, wherein the non-volatile memory device comprises the first latch unit for sensing data and storing the sensed data, and a plurality of second latch units the number of which is one smaller than the number of plural pairs of bit lines to be read or programmed, storing the data stored in the first latch unit in the second latch units through a transfer unit, if the data is transferred from the first latch unit to the second latch units, turning off the transfer unit to electrically separate the first latch unit and the second latch units, storing data in all the plurality of the second latch units, by repeatedly performing the steps of storing a new data in the first latch unit. The method also includes storing the new data stored in the first latch unit in other second latch units through the transfer unit, and if the new data is transmitted from the first latch unit to the other second latch units, turning off the transfer unit to electrically separating the first latch unit and the other second latch units, storing another new data in the first latch unit, and sequentially outputting the data stored in the first latch unit and the second latch unit to a data line through the data I/O unit.

DETAILED DESCRIPTION OF VARIOUS EMBODIMENTS

Figure 1:
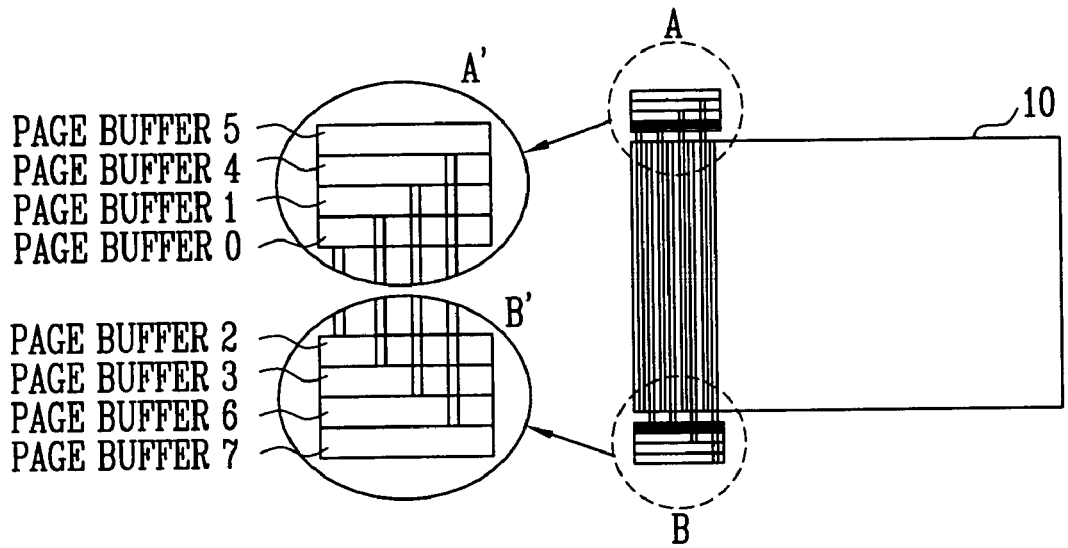
FIG. 1 is a schematic layout diagram of a prior art cell array region and a page buffer.

Various embodiments will be described with reference to the accompanying drawings. Those of ordinary skill in the art will appreciate that the disclosed embodiments may be modified in various manners and the scope of the present patent is not limited by the embodiments disclosed. Like reference numerals are used to identify the same or similar parts.

Figure 2:
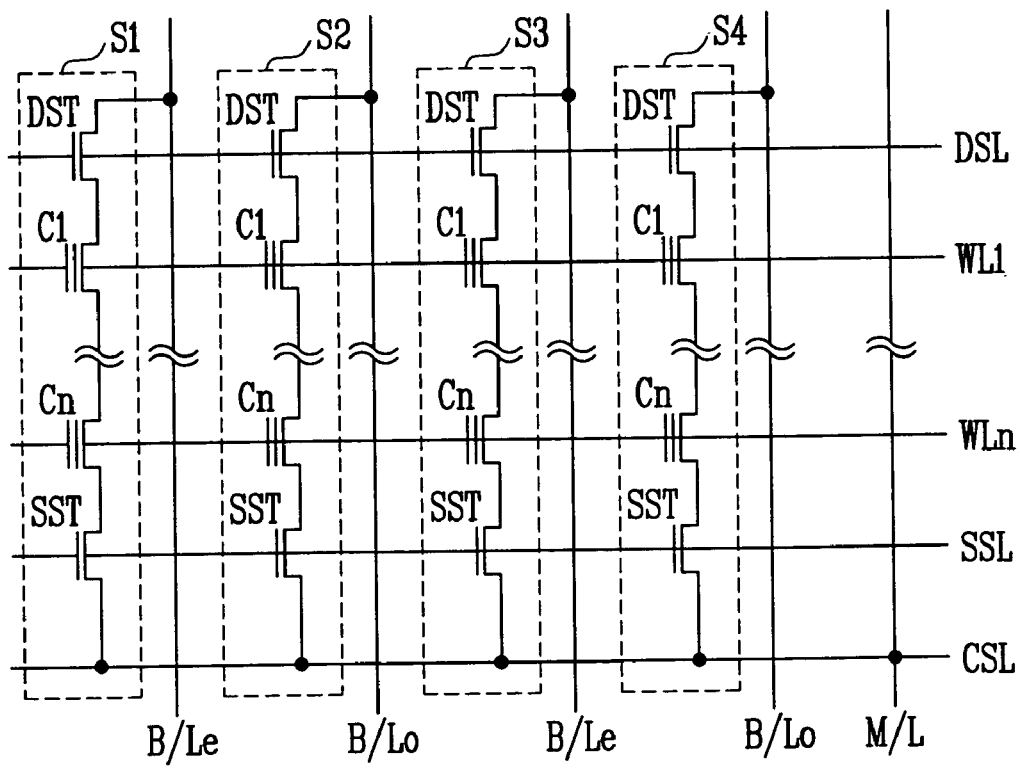
FIG. 2 is a circuit diagram showing some of a cell array region of a NAND type flash memory device.

FIG. 2 is an exemplary circuit diagram showing some of a cell array region of a NAND type flash memory device. Referring to FIG. 2, the cell array region of the NAND type flash memory includes a plurality of strings S1, S2, S3 and S4. 16 or 32 cells are connected to one string. Each of the strings S1, S2, S3 and S4 includes a drain select transistor DST, a plurality of cell transistors C1 to Cn and a source select transistor SST. A drain region of the drain select transistor DST is connected to bit lines Ble and Blo, and a source region of the source select transistor SST is connected to a common source line CSL. Gate terminals of the cell transistors C1 to Cn are connected to word lines WL1 to WLn. A gate terminal of the drain select transistor DST is connected to the drain select line DSL. A gate terminal of the source select transistor SST is connected to the source select line SSL. The bit lines BLe and Blo are connected to bit line select circuits (see "100" in FIG. 4) which select one of the bit lines BLe and Blo in a program and read operation, connect a selected bit line to a first sensing node SO1, and make a non-selected bit line floated. A page buffer (see "170" in FIG. 4) is connected to the bit line select circuits.

Figure 3:
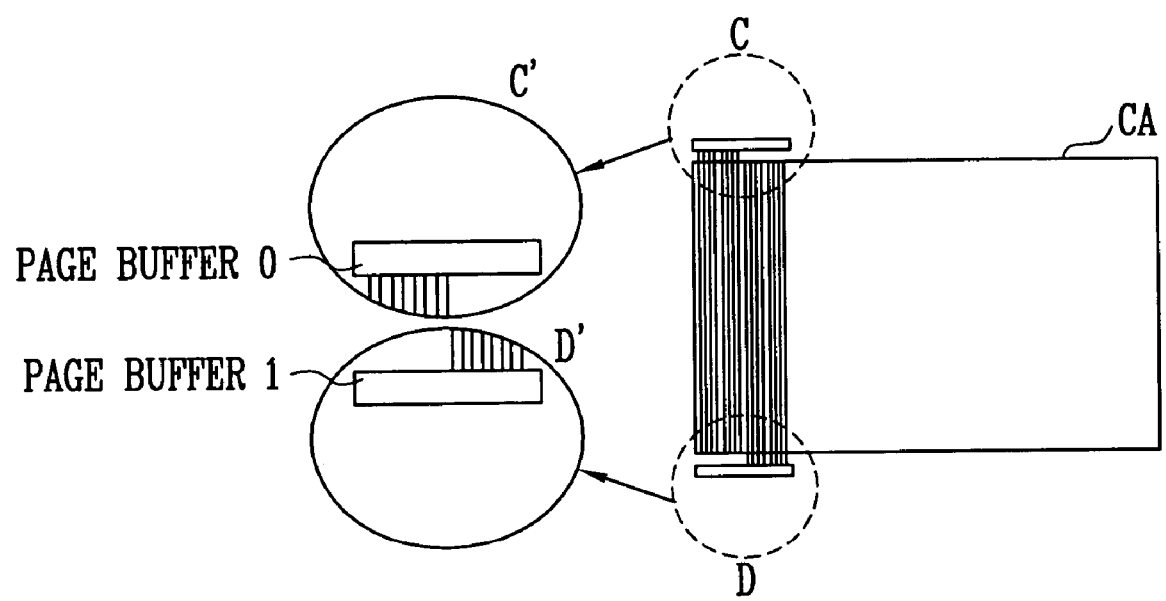
FIG. 3 is a schematic layout diagram of an exemplary cell array region and the page buffer.
Figure 4:
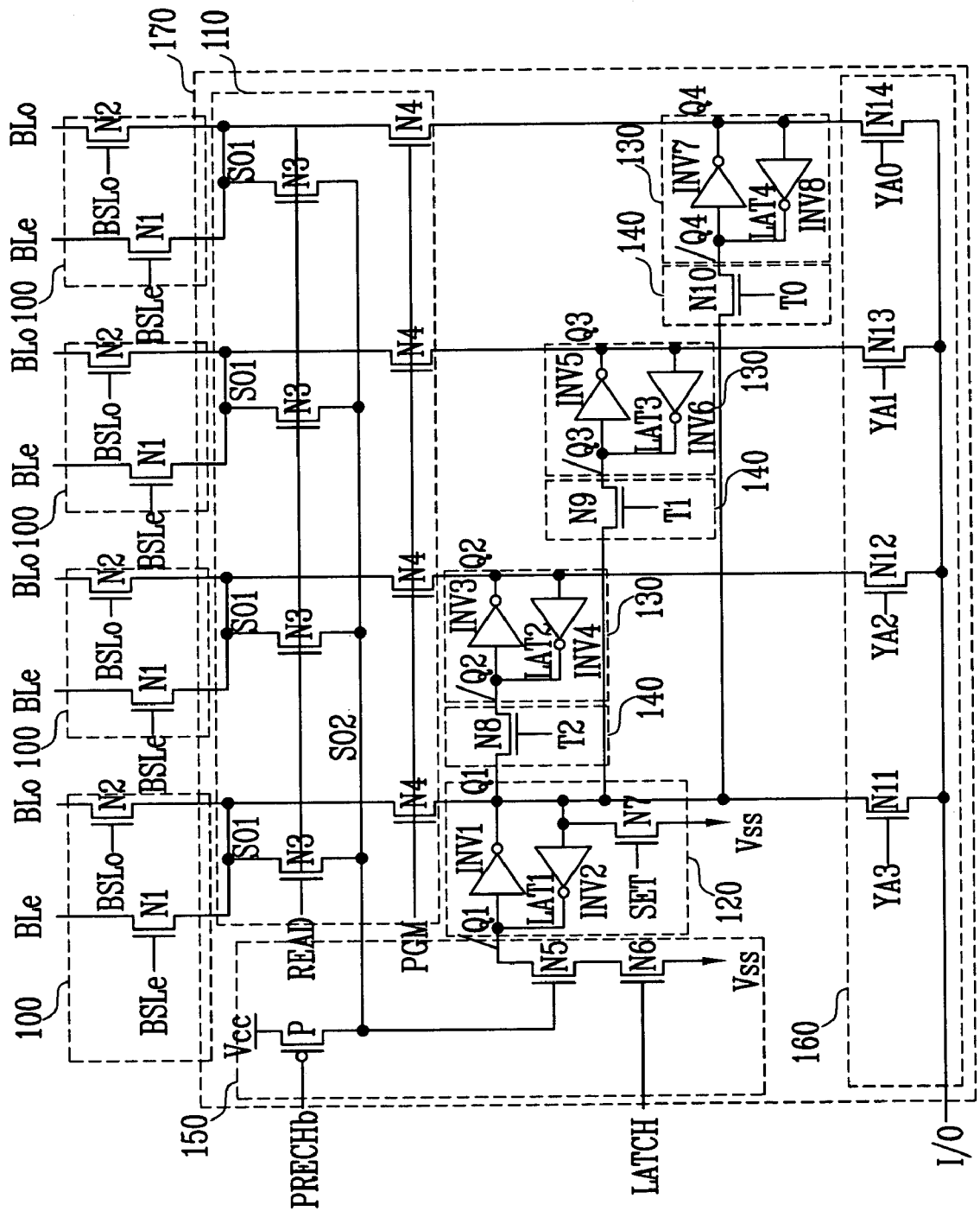
FIG. 4 is a circuit diagram showing an exemplary pager buffer.

FIG. 3 is an exemplary schematic layout diagram of the cell array region and the page buffer. FIG. 4 is an exemplary circuit diagram showing the pager buffer. In FIG. 3, C' and D' are exaggerated views of portions C and D, and reference CA indicates the cell array region.

Referring to FIGS. 3 and 4, a page buffer 170 can perform various functions. If data is to be read from memory cells of a selected page, the page buffer 170 first senses the data of the selected page and then latches the sensed data. This is called a "sense operation." Further, if data is to be programmed from memory cells of a selected page, the page buffer 170 temporarily stores a program data that is received from the outside. This is called a "data loading operation." If a verify operation for verifying whether a programmed/erased cell has a target threshold voltage (or a programmed/erase cell is sufficiently programmed/erased) is performed, the page buffer 170 senses data bits of memory cells of a selected page and latches the sensed data bits, in the same manner as the sensing operation.

The page buffer 170 includes a first latch unit 120 for storing data, one or more second latch units 130 for storing data, transfer units 140 connected between the first latch unit 120 and the second latch units 130, respectively, for transferring the data stored in the first latch unit 120 to the second latch units 130, a path select unit 110 connected to bit lines (bit line select circuits), wherein the path select unit 110 senses data from the bit lines BLe and Blo and stores the sensed data in the first latch unit 120, in a read operation, and transmits the data from the first and second latch units 120, 130 to the bit lines BLe and Blo, in a program operation, a sensing unit 150 that allows the path select unit 110 to sense data or allows the data received from the bit lines BLe and Blo to be stored in the first latch unit 120, and a data I/O unit 160 for transmitting data from a data line I/O to the first and second latch units 120 and 130 or the data stored in the first and second latch units 120 and 130 to the data line I/O.

The page buffer 170 further includes a first latch unit 120 and one or more second latch units 130, for storing data. The first latch unit 120 includes a first latch LAT1 including inverters INV1, INV2, and first and second latch nodes Q1, /Q1. Also, the first latch unit 120 includes a seventh NMOS transistor N7 connected between the first latch node Q1 and the ground voltage terminal (Vss), which is a pull-down transistor for initializing the first latch node Q1. The second latch units 130 include second to fourth latches LAT2, LAT3 and LAT4. The second latch LAT2 includes inverters INV3, INV4, and first and second latch nodes Q2, /Q2. The third latch LAT3 includes inverters INV5, INV6, and first and second latch nodes Q3, /Q3. The fourth latch LAT4 includes inverters INV7, INV8, and first and second latch nodes Q4, /Q4. In this time, the number of the second latch units 130 can be one smaller than the number of plural pairs of the bit lines BLe and Blo which will be read or programmed. In this embodiment, three latches LAT2, LAT3, LAT4 are shown.

Each of the transfer units 140 is connected between the first latch unit 120 and the second latch unit 130, and transfers the data stored in the first latch unit 120 to the second latch unit 130. The transfer units 140 include NMOS transistors N8, N9, N10, respectively, which are controlled by the transfer control signals T2, T1, T0, respectively. In this time, the transfer control signals T2, T1 and T0 control the NMOS transistors N8, N9, N10 to turn on when the data stored in the first latch unit 120 is transferred to the second latch units 130, and to turn off when data is stored in the second latch units 130. In the concrete, an eighth NMOS transistor N8 is connected between the first latch LAT1 and the second latch LAT2. The eighth NMOS transistor N8 is controlled by the transfer control signal T2. A ninth NMOS transistor N9 is connected between the first latch LAT1 and the third latch LAT3. The ninth NMOS transistor N9 is controlled by the transfer control signal T1. A tenth NMOS transistor N10 is connected between the first latch LAT1 and the fourth latch LAT4. The tenth NMOS transistor N10 is controlled by the transfer control signal T0.

The path select unit 110 includes a plurality of first sensing nodes SO1 connected to the pair of the bit lines, a second sensing node SO2 for sensing data, first switches N3 connected between the first sensing nodes SO1 and the second sensing node SO2, respectively, wherein the first switches control a read operation, and second switches N4 connected between the first latch unit 120 and the first sensing nodes SO1 and between the second latch units 130 and the first sensing nodes SO1, wherein the second switches control a program operation. To be specific, each of the third NMOS transistors N3 is connected between the bit line select circuit 100 and the second sensing node SO2. The third NMOS transistor N3 is controlled by a read control signal READ. The fourth NMOS transistors N4 are turned on and off by a program control signal PGM, and they are connected between the first sensing nodes SO1 and first latch nodes Q1, Q2, Q3 and Q4 of the latches LAT1, LAT2, LAT3 and LAT4, respectively. At this time, the number of the first sensing nodes SO1 is the same as that of plural pairs of the bit lines BLe and Blo which will be read or programmed. In this embodiment, the number of the first sensing nodes SO1 is four.

Each of the bit line select circuits 100 is connected to the pair of bit lines BLe and Blo. A first NMOS transistor N1 is connected between the bit line BLe and the first sensing node SO1. The first NMOS transistor N1 is controlled by a control signal BSLe. A second NMOS transistor N2 is connected between the bit line BLo and the first sensing node SO1. The second NMOS transistor N2 is controlled by a control signal BSLo. The first and second NMOS transistors N1, N2 are adapted to select one of the bit lines BLe and Blo, connect a selected bit line to the first sensing node SO1 and make a non-selected bit line floated, in a program/read operation.

The sensing unit 150 includes a pull-up transistor P, which is connected between a power supply voltage terminal (Vcc) and the second sensing node SO2 and is controlled by a control signal PRECHb for precharging the second sensing node SO2 to the level of the power supply voltage (Vcc), and pull-down transistors N5, N6, which are serially connected between the first latch unit 120 and the ground voltage terminal (Vss) and are respectively controlled by a voltage level of the second sensing node SO2 and a latch control signal LATCH. In the concrete, the PMOS transistor P is connected between the power supply voltage terminal (Vcc) and the second sensing node SO2. The PMOS transistor P is controlled by a precharge control signal PRECHb. The fifth and sixth NMOS transistors N5, N6 are serially connected between the second latch node /Q1 of the first latch LAT1 and the ground voltage terminal (Vss). The fifth and sixth NMOS transistors N5, N6 are controlled by the voltage level of the second sensing node SO2 and the control signal LATCH, respectively.

The data I/O unit 160 includes NMOS transistors N11, N12, N13 and N14 which are connected between the data line I/O and the first latch unit 120 and between the data line I/O and the second latch units 130, respectively, in a corresponding manner. The NMOS transistors N11, N12, N13 and N14 are controlled by I/O control signals YA3, YA2, YA1 and YA0 for controlling the data received from the data line I/O to be transmitted to the first and second latch units 120, 130 or the data stored in the first and second latch units 120, 130 to be transmitted to the data line I/O. The control signals YA3, YA2, YA1 and YA0 are generated based on column address information. To be specific, the eleventh to fourteenth NMOS transistors N11, N12, N13 and N14 are connected between the first latch nodes Q1, Q2, Q3 and Q4 of the latches LAT1, LAT2, LAT3 and LAT4 and the data line I/O. The eleventh to fourteenth NMOS transistors N11, N12, N13 and N14 are turned on/off by the control signals YA3, YA2, YA1 and YA0.

A program operation will now be described.

Data from the data line I/O is loaded onto the respective latch units 120, 130. The loaded data is programmed into the memory cells through the fourth NMOS transistor N4 connected to the bit lines BLe and Blo according to the program signal PGM. In this time, the latch units 120, 130 are loaded with data in a byte (corresponding to 8 bits) unit.

The program operation will now be described in detail. The eleventh NMOS transistor N11 of the data I/O unit 160 is turned on and data to be programmed is loaded from the data line I/O to the first latch node Q1 of the first latch LAT1. If the data is stored in the first latch node Q1 of the first latch LAT1, the eleventh NMOS transistor N11 is turned off. The twelfth NMOS transistor N12 of the data I/O unit 160 is then turned on and data to be programmed is loaded from the data line I/O to the first latch node Q2 of the second latch LAT2. If the data is stored in the first latch node Q2 of the second latch LAT2, the twelfth NMOS transistor N12 is turned off. Next, the thirteenth NMOS transistor N13 of the data I/O unit 160 is turned on and data to be programmed is loaded from the data line I/O to the first latch node Q3 of the third latch LAT3. If the data is stored in the first latch node Q3 of the third latch LAT3, the thirteenth NMOS transistor N13 is turned off. Thereafter, the fourteenth NMOS transistor N14 of the data I/O unit 160 is turned on and data to be programmed is loaded from the data line I/O to the first latch node Q4 of the fourth latch LAT4. If the data is stored in the first latch node Q4 of the fourth latch LAT4, the fourteenth NMOS transistor N14 is turned off. As such, the data to be programmed is sequentially stored in the first to fourth latches LAT1 to LAT4. The data stored in the first to fourth latches LAT1 to LAT4 are programmed into a page of a memory cell array through the fourth NMOS transistor N4 according to the program control signal PGM.

A read operation will be below described.

In the read operation or a program-verifying operation, data stored in memory cells of a selected page is sensed through the first latch unit 120. In order to perform a program-verifying operation, the bit lines BLe, BLo and the second sensing node SO2 are first discharged. Thereafter, a selected bit line (e.g., Ble) is charged with a given voltage and is then floated.

In order to perform the read operation, the first latch node Q1 of the first latch unit 120 is initialized. In order for the first latch node Q1 to take "0" which is a logical LOW level through initialization of the first latch node Q1, a control signal SET is shifted from a LOW level to a HIGH level, so that the seventh NMOS transistor N7 is turned on. The control signal SET keeps the LOW level after the first latch node Q1 is initialized.

Thereafter, the second sensing node SO2 is precharged. To this end, as the control signal PRECHb shifts from a HIGH level to a LOW level, the second sensing node SO2 becomes the level of the power supply voltage (Vcc). As the second sensing node SO2 becomes the level of the power supply voltage (Vcc), the fifth NMOS transistor N5 is turned on, the second latch node /Q1 keeps "1" which is a logical HIGH level and the first latch node Q1 keeps "0" which is a logical LOW level. In this time, the control signal LATCH is LOW and the sixth NMOS transistor N6 is turned off.

In order to perform the read operation, if the control signal LATCH becomes a HIGH level, the sixth NMOS transistor N6 is turned on and the control signal READ becomes a HIGH level, whereby the third NMOS transistor N3 is turned on.

The bit line select circuit 100 selects a bit line and senses data of a sensed cell.

If a selected memory cell is not programmed, the current supplied to the second sensing node SO2 will be discharged through the selected memory cell. This causes the voltage of the second sensing node SO2 to fall below the threshold voltage of the fifth NMOS transistor N5, so that the fifth NMOS transistor N5 is turned off. Although the sixth NMOS transistor N6 is turned on, the state of the first latch unit LAT1 keeps intact. Since the control signal SET keeps the LOW level and the seventh NMOS transistor N7 is turned on, the first latch node Q1 has data of "0" which is a logical LOW level.

If the selected cell is programmed, the current supplied through the PMOS transistor P is gradually charged into the second sensing node SO. This causes the voltage of the second sensing node SO2 to rise over the threshold voltage of the fifth NMOS transistor M5, so that the fifth NMOS transistor N6 is turned on. If the sixth NMOS transistor N6 is turned on, the second latch node /Q1 becomes the level of the ground voltage and the first latch node Q1 has data "1" which is a logical HIGH level.

As described above, the first data stored in the first latch LAT1 is transferred to the second latch LAT2 through the transfer transistor N8. If the first data is transmitted from the first latch LAT1 to the second latch LAT2, the transfer transistor N8 is turned off to electrically separate the first latch LAT1 and the second latch LAT2.

A new second data is then stored in the first latch LAT1. The second data stored in the first latch LAT1 is transferred to the third latch LAT3 through the transfer transistor N9. If the second data is transmitted from the first latch LAT1 to the third latch LAT3, the transfer transistor N9 is turned off to electrically separate the first latch LAT1 and the third latch LAT3.

Thereafter, a new third data is stored in the first latch LAT1. The third data stored in the first latch LAT1 is transferred to the fourth latch LAT4 through the transfer transistor N10. If the third data is transmitted from the first latch LAT1 to the fourth latch LAT4, the transfer transistor N10 is turned off to electrically separate the first latch LAT1 and the fourth latch LAT4.

A new fourth data is then stored in the first latch LAT1.

As in the above, transmission and storage of data are made possible by electrically separating the first latch LAT1 and the latches LAT2, LAT3 and LAT4. As described above, the data of the selected cell, which is stored in the respective latches LAT1, LAT2, LAT3 and LAT4, is sequentially outputted to the data line I/O through the data I/O unit 160.

In the disclosed embodiment, one page buffer can replace conventional four page buffers. Also, according to the present patent, one page buffer can replace conventional four or more page buffers on the condition that the path select unit 110, the second latch units 130, the transfer unit 140 and the data I/O unit 160 are suitably disposed in agreement with the number of pairs of bit lines that will be read or programmed.

As described above, according to the present patent, the number of page buffers is reduced through the use of data latches. It is thus possible to prevent a fail phenomenon due to coupling capacitance of sensing nodes.

Furthermore, according to the present patent, one page buffer can replace conventional four or more page buffers. Therefore, the present patent is advantageous in that the layout can be reduced because the number of page buffers is reduced.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A page buffer of a non-volatile memory device, comprising:
   a first latch unit for storing data;
   one or more second latch units for storing data;
   transfer units connected between the first latch unit and the second latch units, for transferring the data stored in the first latch unit to the second latch units;
   a path select unit that senses data from bit lines and stores the sensed data in the first latch unit, in a read operation, and transfers the data from the first and second latch units to the bit lines, in a program operation;
   a sensing unit for allowing the path select unit to sense data or allowing the data received from the bit lines to be stored in the first latch; and
   a data I/O unit for transferring the data from a data line to the first and second latch units or the data stored in the first and second latch units to the data line.

2. The page buffer according to claim 1, wherein the path select unit comprises:
   a plurality of first sensing nodes each connected to a pair of the bit lines;
   a second sensing node for sensing data;
   first switches connected between the plurality of the first sensing nodes and the second sensing node, respectively, for controlling a read operation; and
   second switches connected between the first latch unit and the first sensing nodes and between the second latch units and the first sensing nodes, thus controlling a program operation.

3. The page buffer according to claim 2, wherein the first switches include NMOS transistors which are controlled according to a read control signal.

4. The page buffer according to claim 2, wherein the second switches include NMOS transistors which are controlled according to a program control signal.

5. The page buffer according to claim 2, wherein the number of the first sensing nodes is the same as that of plural pairs of the bit lines that will be read or programmed.

6. The page buffer according to claim 5, wherein the first sensing nodes are four in number.

7. The page buffer according to claim 2, wherein the sensing unit comprises:
   a pull-up transistor which is connected between a power supply voltage terminal and the second sensing node and is controlled according to a control signal for precharging the second sensing node to the level of a power supply voltage; and
   pull-down transistors which are serially connected between the first latch unit and a ground voltage terminal, respectively, and are controlled according to a voltage level of the second sensing node and a latch control signal.

8. The page buffer according to claim 1, wherein the first latch unit comprises:
   a first inverter;
   a second inverter, the second inverter having an input which is connected to a first latch node which is an output node of the first inverter; and
   a pull-down transistor connected between the first latch node and the ground voltage terminal, for initializing the first latch node.

9. The page buffer according to claim 1, wherein the second latch units comprise latches having a first inverter, and a second inverter, the second inverter having an input which is connected to a first latch node which is an output node of the first inverter,
   wherein the output of the second inverter becomes the input of the first inverter.

10. The page buffer according to claim 1, wherein the number of the second latch units is one smaller than the number of plural pairs of the bit lines that will be read or programmed.

11. The page buffer according to claim 10, wherein the second latch units are four in number.

12. The page buffer according to claim 1, wherein the transfer unit comprises NMOS transistors which are turned on when the data stored in the first latch unit is transmitted to the second latch unit, and are turned off when data is stored in the second latch units, according to a transfer control signal.

13. The page buffer according to claim 1, wherein the data I/O unit includes a plurality of NMOS transistors connected between the data line and the first latch unit and between the data line and the second latch units in a corresponding manner, respectively, wherein the data I/O unit transmits data from the data line to the first and second latch units or the data stored in the first and second latch units to the data line.

14. A method of programming a non-volatile memory device, comprising the steps of:
   storing data in a first latch unit;
   sequentially storing data in a plurality of second latch units the number of which is one smaller than the number of plural pairs of bit lines to be read or programmed; and
   selecting a memory cell to be programmed and programming the data stored in the first latch unit and the second latch units into the selected memory cell according to a program control signal.

15. The method according to claim 14, wherein the method of programming the non-volatile memory device is performed using a page buffer of the non-volatile memory device.

16. A method of reading a non-volatile memory device, comprising the steps of:
   sensing data of a selected memory cell and storing the sensed data in a first latch unit, wherein the non-volatile memory device comprises the first latch unit for sensing data and storing the sensed data, and a plurality of second latch units, the number of which is one less than that of plural pairs of bit lines to be read or programmed;
   storing the data stored in the first latch unit in the second latch units through a transfer unit;
   if the data is transferred from the first latch unit to the second latch units, turning off the transfer unit to electrically separate the first latch unit and the second latch units;
   storing all data in the plurality of the second latch units, by repeatedly performing the steps of storing a new data in the first latch unit, storing the new data stored in the first latch unit in other second latch units through the transfer unit, and if the new data is transmitted from the first latch unit to the other second latch units, turning off the transfer unit to electrically separating the first latch unit and the other second latch units;
   storing another new data in the first latch unit; and
   sequentially outputting the data stored in the first latch unit and the second latch unit to a data line through the data I/O unit.

17. The method according to claim 16, wherein the method of reading the non-volatile memory device is performed using a page buffer of the non-volatile memory device.

* * * * *